United States Patent
Kim et al.

(10) Patent No.: US 9,257,660 B2
(45) Date of Patent: Feb. 9, 2016

(54) METHOD FOR FABRICATING SINGLE ELECTRON TRANSISTOR HAVING NANOPARTICLES OF UNIFORM PATTERN ARRANGEMENT

(71) Applicant: SK INNOVATION CO., LTD., Seoul (KR)

(72) Inventors: Jun-Hyung Kim, Daejeon (KR); Young-Keun Lee, Seoul (KR); Hong You, Daejeon (KR); Tae-Hee Kim, Seoul (KR)

(73) Assignee: SK INNOVATION CO., LTD., Seoul (KR)

( * ) Notice: Subject to any disclaimer, the term of this patent is extended or adjusted under 35 U.S.C. 154(b) by 0 days.

(21) Appl. No.: 14/199,572

(22) Filed: Mar. 6, 2014

(65) Prior Publication Data

US 2014/0252315 A1    Sep. 11, 2014

(30) Foreign Application Priority Data

Mar. 6, 2013 (KR) .................. 10-2013-0023963
Mar. 6, 2013 (KR) .................. 10-2013-0023998
Mar. 6, 2013 (KR) .................. 10-2013-0024103

(51) Int. Cl.
*H01L 51/05* (2006.01)
*H01L 51/00* (2006.01)

(52) U.S. Cl.
CPC ........ *H01L 51/0566* (2013.01); *H01L 51/0001* (2013.01); *H01L 51/0558* (2013.01); *H01L 51/0012* (2013.01); *H01L 51/0014* (2013.01)

(58) Field of Classification Search
CPC ............ H01L 51/0566; H01L 51/0558; H01L 51/001; H01L 51/0012; H01L 51/0014
See application file for complete search history.

(56) References Cited

U.S. PATENT DOCUMENTS

| 2006/0099430 A1 | 5/2006 | Subramanya et al. |
| 2010/0327260 A1 | 12/2010 | Choi et al. |
| 2012/0201860 A1* | 8/2012 | Weimer et al. ................ 424/400 |

FOREIGN PATENT DOCUMENTS

EP    2 362 459    8/2011

OTHER PUBLICATIONS

Novembre, C., et al., Gold nanoparticle-pentacene memory transistors, Applied Physics Letters, 2008, pp. 103314-1-103314-3, vol. 92, No. 10.

Jain, T., et al., Aligned Growth of Gold Nanorods in PMMA Channels: Parallel Preparation of Nanogaps, ACS NANO, 2012, pp. 3861-3867, vol. 6, No. 5.

Feldheim, D. L., et al., Self-assembly of single electron transistors and related devices, Chemical Society Reviews, 1998, pp. 1-12, vol. 27, No. 1.

(Continued)

*Primary Examiner* — Michael Jung
*Assistant Examiner* — Charles R Peters
(74) *Attorney, Agent, or Firm* — IP & T Group LLP

(57) ABSTRACT

A transistor and a fabrication method thereof. A transistor includes a channel region including linkers, formed on a substrate, and metallic nanoparticles grown from metal ions bonded to the linkers, a source region disposed at one end of the channel region, a drain region disposed at the other end of the channel region opposite of the source region, and a gate coupled to the channel region and serving to control migration of charges in the channel region. The metallic nanoparticles have a substantially uniform pattern arrangement in the channel region.

20 Claims, 7 Drawing Sheets

(56) References Cited

OTHER PUBLICATIONS

Jana, N. R., et al., Wet Chemical Synthesis of High Aspect Ratio Cylindrical Gold Nanorods, Journal of Physical Chemistry B, 2001, pp. 4065-4067, vol. 105, No. 19.

Sperling, R. A., et al., Surface modification, functionalization and bioconjugation of colloidal inorganic nanoparticles, Philosophical Transactions of the Royal Society A, 2010, pp. 1333-1383, vol. 368, No. 1915.

Kisner, A., et al., In situ fabrication of ultrathin porous alumina and its application for nanopattenring Au nanocrystals on the surface of ion-sensitive field-effect transistors, Nanotechnology, 2012, pp. 485301-1-485301-9, vol. 23, No. 48.

The extended European Search Report issued by the European Patent Office on Jun. 18, 2014.

* cited by examiner (A)

(B)

(C)

METHOD FOR FABRICATING SINGLE ELECTRON TRANSISTOR HAVING NANOPARTICLES OF UNIFORM PATTERN ARRANGEMENT

CROSS-REFERENCE TO RELATED APPLICATIONS

The present application claims priority of Korean Patent Application Nos. 10-2013-0023963, 10-2013-0023998, and 10-2013-0024103, filed on Mar. 6, 2013, which are incorporated herein by reference in their entirety.

BACKGROUND

1. Field

Various embodiments of the present disclosure relate to a single electron transistor comprising nanoparticles of a substantially uniform pattern arrangement, and a fabrication method thereof.

2. Description of the Related Art

Transistors in semiconductor devices have been continuously scaled down to increase performance, reduce power consumption, and reduce price. However, there are limits to how far transistors can be scaled down while keeping the ability to operate stably at low voltages with manageable current leakage. To attain tera-scale integration, a structural change in transistors is required.

As a way of satisfying this requirement, a single electron transistor has been developed as disclosed in US Unexamined Patent Publication No. 20100327260. The single electron transistor provides advantages in terms of low power consumption and high integration density because the operation of the transistor is controlled by the migration of a single electron under a low operating voltage.

To operate a single electron transistor at room temperature, as necessary for commercially usable products, the technology of reproducibly forming nanometer sized quantum dots at desired positions (forming one to several tens of quantum dots having a precisely controlled and uniform size at specific positions) is required. Further, there has been continued demand for technology fabrication processes to be commercially performed without the use of expensive equipment and highly complicated processes. The development of technology that satisfies these needs has yet to been reported.

SUMMARY

Various embodiments are directed to a transistor capable of being operated in a reliable manner and a fabrication method thereof.

Also, various embodiments are directed to a transistor which can be produced in large quantities within a short time by commercially available and cost-effective methods, and a fabrication method thereof.

In an embodiment, a transistor may include: a channel region including linkers formed on a substrate and metallic nanoparticles grown from metal ions bonded to the linkers; a source region disposed at one end of the channel region; a drain region disposed at the other end of the channel region opposite of the source region; and a gate coupled to the channel region to control migration of charges in the channel region. The metallic nanoparticles have a substantially uniform pattern arrangement in the channel region.

In the channel region, the metallic nanoparticles may be arranged separately in a direction extending from the source region to the drain region.

By defining a unit by an aggregate in which the metallic nanoparticles are separately aggregated, a plurality of aggregates may be arranged in the channel region. The aggregate may have a band shape, a line shape, a circular shape or a polygonal shape.

The linkers may be organic monomolecules bonded to a surface of the substrate by self-assembly.

The channel region may further include a dielectric organic material which is bonded to or coated on surfaces of the metallic nanoparticles.

The channel region may further include an organic surfactant bonded to the metal ions or the nanoparticles which are being grown, including at least one of a first organic material and a second organic material. The first organic material may be a nitrogen- or sulfur-containing organic material and the second organic material may be a phase-transfer catalyst-based organic material.

The metallic nanoparticles may have an average particle radius of about 0.5 nm to 1 nm, and a standard deviation of the particle radius may be ±20% or less.

The substrate may have a surface layer capable of bonding with the linkers.

The surface layer may be one selected from the group including metals, metal oxides, semiconductors and semiconductor oxides.

The substrate may be a flexible substrate and the flexible substrate may include a surface layer having a hydroxyl (—OH) functional group.

The linkers may be organic monomolecules and the channel region may further include a linker layer composed of a self-assembled monomolecular layer formed of a plurality of the organic monomolecules bonded to the substrate.

The channel region may further include a silane compound layer formed on the substrate and having a functional group selected from among an amine group, a carboxyl group and a thiol group, and a functional group selected from among an amine group, a carboxyl group and a thiol group may be portions of the linkers.

The linkers may include a functional group selected from among an amine group (—$NH_2$), a carboxyl group (—COOH) and a thiol group (—SH), which may bond with the metal ions.

The metallic nanoparticles may be selected from the group including metal nanoparticles, metal oxide nanoparticles, metal nitride nanoparticles, metal carbide nanoparticles, and intermetallic compound nanoparticles.

The metallic nanoparticles in the channel region may be separately arranged from one another and form a single layer.

The single electron transistor may further include a gate dielectric layer interposed between the channel region and the gate.

In an embodiment, a method for forming a channel of a transistor may include: forming a substrate; forming a porous mask which has a plurality of pores on the substrate; forming linkers on the substrate which is selectively exposed by the porous mask; bonding metal ions to the linkers; and forming metallic nanoparticles from the metal ions.

The method may further include bonding a dielectric inorganic material to surfaces of the metallic nanoparticles.

The method may further include applying energy in forming metallic nanoparticles, and supplying an organic surfactant including at least one of a first organic material and a second organic material, before or/and during the applying of the energy.

The porous mask may include a single layer of nanobeads as a material which does not spontaneously bond with the linkers.

Before forming the linkers, the method may further include forming a thin layer of a material which spontaneously bonds with the linkers on the substrate, which is selectively exposed by the porous mask; and removing the porous mask.

The material which spontaneously bonds with the linkers may include a metal, a metal oxide, a semiconductor, a semiconductor oxide, a composite metal oxide, or a stack thereof.

The linker layer is a self-assembled monomolecular layer that may be composed of organic monomolecules. The linker layer may be formed by bringing a surface of the substrate into contact with a linker solution in which the linkers are dissolved in a solvent.

As another method, the linker layer may be formed by atomic layer deposition using a gas containing the linkers. The linker layer may be a silane compound layer including any one selected from among an amine group, a carboxyl group and a thiol group.

The bonding of the metal ions may include bringing a metal precursor into contact with the substrate which is formed with the linkers.

The bonding of the metal ions may include applying a solution of a metal precursor to the substrate which is formed with the linkers, or supplying a gaseous metal precursor to the substrate which is formed with the linkers.

The energy may be at least one selected from the group including heat energy, chemical energy, light energy, vibration energy, ion beam energy, electron beam energy, and radiation energy.

A different kind of element than the metal ions may be supplied during energy application to change the metallic nanoparticles into any one selected from the group including metal nanoparticles, metal oxide nanoparticles, metal nitride nanoparticles, metal carbide nanoparticles and intermetallic compound nanoparticles.

In an embodiment, a device may include: a substrate, a plurality of linkers formed over the substrate, a plurality of metallic nanoparticles grown from a plurality of metal ions bonded to the linkers; and a structure suitable for controlling migration of a single electron through each metallic nanoparticle. The metallic nanoparticles have a substantially uniform pattern arrangement.

The structure may be a gate coupled to a channel region.

In an embodiment, a method of semiconductor fabrication may include: forming a substrate with a channel region, forming a porous mask with a plurality of pores in a channel region that selectively exposes the substrate, forming linkers on the channel region of the substrate, which is selectively exposed by the porous mask, bonding metal ions to the linkers, and forming metallic nanoparticles from the metal ions.

DETAILED DESCRIPTION

Figure 1:
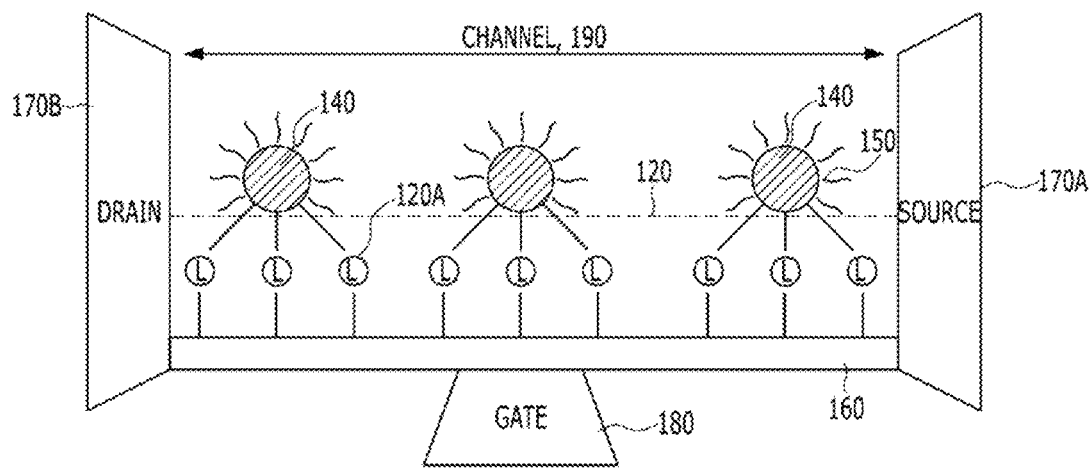
FIG. 1 is a schematic view showing the structure of a single electron transistor in accordance with an embodiment of the present disclosure.

Hereinafter, a single electron transistor and a fabrication method thereof according to embodiments of the present disclosure will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In addition, the drawings are not necessarily to scale and, in some instances, proportions may have been exaggerated in order to clearly illustrate features of the embodiments. Throughout the disclosure reference numerals correspond directly to the like numbered parts in the various figures and embodiments of the present invention.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Unless otherwise defined all terms used herein, including technical or scientific terms, have the same meanings as understood by those skilled in the technical field to which the present disclosure pertains. In the following description, the detailed description of known functions and configurations will be omitted when it may obscure the subject matter of the present disclosure.

FIG. 1 is a schematic view showing the structure of a single electron transistor in accordance with an embodiment of the present disclosure.

Referring to FIG. 1, a single electron transistor may include a channel region 190, a source region 170A disposed at one end of the channel region 190, a drain region 170B disposed at the other end of the channel region opposite of the source region 170A, and a gate 180 coupled to the channel region 190 to control the migration of charges in the channel region 190. Between the channel region 190 and the gate 180, a gate dielectric layer 160 may be interposed.

The channel region 190 of a single electrode transistor may include at least one linkers 120A and metallic nanoparticles 140 grown from metal ions bonded to the linkers 120A. The channel region 190 may further include a dielectric organic material 150 bonded to the surface of the metallic nanoparticles 140.

The channel region 190 of a single electrode transistor includes metallic nanoparticles 140. The metallic nanoparticles 140 may be formed into a layer by bonding metal ions to the surface of a substrate using linkers 120A as a medium and then applying energy to induce the nucleation and growth of the metallic ions.

A plurality of linkers 120A are bonded to the substrate of the channel region 190 to form a linker layer 120. The linker layer 120 may be a self-assembled monomolecular layer or may be a silane compound layer formed by deposition.

The channel region 190 may have a low surface roughness of about 0.1 nm RMS to 4.0 nm RMS, preferably about 0.2 nm RMS to 3.0 nm PMS. The low surface roughness of about 0.1 nm RMS to 4.0 nm RMS may guarantee operational stability, reproducibility and reliability of the transistor. The low surface roughness may be obtained by forming the nanoparticles 140 (in situ) by the application of energy to metal ions bonded to the linkers. The RMS roughness may indicate an average surface roughness measured by an atomic force microscope (AEM), and may be an RMS roughness value obtained by measuring the surface roughness of the channel region, which includes nanoparticles separately arranged from one another and/or a dielectric organic material surrounding the nanoparticles, by AFM. In addition, the nanoparticles 140 may be arranged in a specific pattern in the channel region 190. In this case, the surface roughness (in RMS) may be obtained by measuring the surface of at least the region in which the nanoparticles are disposed.

The nanoparticles 140 may have an average particle radius of 0.5 nm to 1 nm. While it is known that nanoparticles having a size of 20 nm or less are generally required to realize a single electron transistor, a limitation exists in that the operating temperature of a transistor decreases as the size of the nanoparticles increases. According to an embodiment of the present disclosure, when transition metal nanoparticles having an average particle radius of about 0.5 nm to 1 nm are separately arranged from one another in the channel region 190, the operating temperature of a transistor may be significantly increased. Specifically, nanoparticles having an average particle radius of 0.5 nm to 1 nm enable the transistor to operate at room temperature.

The nanoparticles 140 may have an average particle radius of about 0.5 nm and 1 nm and a particle radius of ±20% or less, or preferably, ±0.1% to ±15%. Such a fine particle radius and narrow particle size distribution enables the surface roughness of the channel to be low. The low surface roughness of the channel region is attributable to the nanoparticles themselves, not to the dielectric organic material 150 surrounding the nanoparticles that form the surface of the channel.

The length of the channel region 190 in a direction extending from the source region 170A to the drain region 170B may be about 5 nm to 200 nm. Channel region lengths of 5 nm or over may be achieved due to the ease and realizability of the process. The length of the channel region may be, and likely should be, 200 nm or less to improve the operational stability of the transistor, guarantee uniformity in the size of nanoparticles, and more quickly achieve formation of particles when applying scanning energy. When the channel region has a length of about 5 nm to 200 nm, the width of the channel region may be about 5 nm to 1000 nm, preferably about 10 nm to 500 mm, and even more preferably, about 10 nm to 200 nm.

In a single electron transistor according to an embodiment of the present disclosure, the nanoparticle density (the number of the nanoparticles 140 per a unit area) of the channel region 190 may be about $0.2 \times 10^{14}$ to $2.0 \times 10^{14}$ nanoparticles/cm$^2$. When the nanoparticles are distributed uniformly, one to several hundred nanoparticles may be disposed in the channel when viewed in the lengthwise direction of the channel.

In a single electron transistor according to an embodiment of the present disclosure, the separation distance between adjacent nanoparticles 140 disposed in the channel region 190 (the separation distance between most adjacent nanoparticles) may be about 0.2 nm to 5 nm. The channel region 190 may have a structure where the nanoparticles 140 are embedded in a dielectric matrix or dielectric shells may be formed around the nanoparticles. The dielectric may be the dielectric organic material 150 itself. The separation distance between the nanoparticles 140 may determine the distance of tunneling barriers formed between the nanoparticles 140. The separation distance between the nanoparticles 140 is a distance that allows the tunneling and/or hopping of electrons to be easily induced by application of a gate voltage and prevents transistor misoperation and current leakage of the transistor in an idle state. The structure where the nanoparticles 140, having an average particle radius of about 0.5 nm to 1 nm, are arranged in the channel region 190 and uniformly separated from each other by a distance of about 0.2 nm to 5 nm may be realized by forming the nanoparticles 140 through in situ reduction and growth of linker-bonded metal ions as described above.

The total number of atoms of the metallic nanoparticles 140 disposed in the channel region 190 may satisfy the following relationship equation 1, preferably relationship equation 1-1, and more preferably relationship equation 1-2.

$$0.8 Nml \leq Nnp \leq 1 Nml \quad \text{(Relationship equation 1)}$$

$$0.9 Nml \leq Nnp \leq 1 Nml \quad \text{(Relationship equation 1-1)}$$

$$0.98 Nml \leq Nnp \leq 1 Nml \quad \text{(Relationship equation 1-2)}$$

In the relationship equations 1, 1-1, and 1-2, Nml is the total number of charged metal atoms of the metal ions bonded to the substrate by the medium of linkers, and Nnp is the total number of neutral metal atoms forming all the metallic nanoparticles disposed in the channel region.

The size and the separation distance of the nanoparticles 140 disposed in the channel region 190 may have a proportional relationship. Before application of energy (including chemical reduction energy), the linker layer having metal ions bonded thereto is composed of a monomolecular layer in the channel region. Because the metal ions of this monomolecular layer serve as the sole source of supply material to be used for nucleation and growth of nanoparticles, the separation distance between the nanoparticles may increase as the size thereof increases, and the separation distance between the nanoparticles may decrease as the size thereof decreases. The nanoparticle size and the separation distance between nanoparticles may be controlled by the diffusion distance of metal atoms (or ions) when energy applied to the monomolecular layer. That is to say, as the diffusion distance of metal atoms (or ions) is increased by the application of energy, a material source capable of contributing to the growth of the transition metal nucleus is enlarged.

As described above, as the nanoparticles 140 are formed in situ in the channel region 190 using metal ions bonded to linkers as a single material source, therefore the nanoparticle size and separation distance between the nanoparticles disposed in the channel region may be substantially uniform.

In a single electron transistor according to an embodiment of the present disclosure, the channel region may include nanoparticles 140 separately arranged from one another and surrounded by a dielectric organic material 150. In detail, the channel region 190 may have a structure where nanoparticles 140 are embedded in a dielectric matrix or a structure in which core-shell particles, including dielectric shells, surround the nanoparticles 140 forming cores. The weight ratio between the nanoparticles and the dielectric of the channel region 190 may be about 1:0.5 to 5. The weight ratio between transition metal nanoparticles and the dielectric is a weight ratio that provides stable tunneling barriers, prevents leakage current, and allows the operation of the transistor to be reliably controlled by a gate voltage.

In the single electron transistor according to an embodiment of the present disclosure, since the dielectric (including the dielectric organic material 150) contained in the channel region 190 provides tunneling barriers between the nanoparticles and between the nanoparticles and the source/drain regions, the dielectric may be distributed uniformly in the channel region 190, and the dielectric present between the nanoparticles 140 may have a uniform thickness. The dielectric of the channel region 190 may be the dielectric organic material 150 chemically bonded to the metal of the nanoparticles. Namely, the dielectric which is contained in the channel region 190 may be the dielectric organic material 150 which chemically bonds with a metal element disposed on the surfaces of the nanoparticles and forms dielectric shells surrounding the nanoparticles. As the dielectric organic material 150 spontaneously forms chemical bonds with the metal of the nanoparticles, it is possible to form a substantially uniform dielectric layer on the nanoparticles, and the thickness of the dielectric layer on the nanoparticles may also be maintained at a substantially constant level. It is sufficient that the dielectric organic material 150 be a dielectric organic material which has a functional group bonding with a metal. In a concrete example, the dielectric organic material 150, which spontaneously bonds with a metal, may have, at one end, a functional group such as a thiol group (—SH), a carboxyl group (—COOH) and/or an amine group (—NH$_2$), which is capable of spontaneously forming a chemical bond with a metal, and, at the other end, a functional group such as a methyl group, which does not react with a metal, and may include, in the backbone, an alkane chain enabling the formation of a uniform dielectric layer. The thickness of the dielectric layer may be controlled by the carbon number of the alkane chain. When considering that the nanoparticles 140 arranged with a separation distance of about 0.5 nm to 1 nm are formed in the channel region 190 by application of energy, the dielectric organic material 150 may be an organic compound having an alkane chain represented by —(CnHn$^{+2}$), where "n" may range from 3 to 20.

In a single electron transistor according to an embodiment of the present disclosure, the nanoparticles 140 disposed in the channel region 190 may be separately arranged from one another while forming a single layer. If the nanoparticles 140 come into direct contact with one another, adverse effects may be exerted on the electrical properties and the effective operating temperature of the single electron transistor. However, where metal ions are bonded to the substrate by a medium of linkers and form nanoparticles, as in the embodiments of the present invention, undesired physical contact between nanoparticles 140 in the channel region 190 may be prevented and a single layer of nanoparticles 140 may be formed.

Specific materials and structure constituting the channel region 190 will be described in further detail in a fabrication method embodiment with reference to FIGS. 2 to 6.

After the channel region of the single electron transistor is formed on the substrate, the source/drain regions and the gate may be formed. In another embodiment, after at least one of the source region, drain region, and the gate is formed on the substrate, the channel region may be formed.

The channel region 190 may be a substrate surface region between the source and drain regions that are separated from and opposite to each other on the substrate. The channel region may be preliminarily defined according to the design of the transistor. The shape of the channel region 190 may be a one-dimensional line shape or a two- or three-dimensional polygonal shape. Further, the substrate surface corresponding to the channel region may be disposed in the same line as the substrate surface under the source and drain regions or may be disposed on or beneath the substrate surface on which the source and drain regions are formed. In other words, when viewed geometrically, the channel region 190 may have a completely flat shape or a protruding or depressed structure.

The source and drain regions may form an electric field in a direction parallel to the channel and the length of the channel may be determined by the separation distance between the source and drain regions opposite each other. The separation distance between the source and drain regions may be changed depending on the design of the transistor. The separation distance between the source and drain regions may be 5 mm to 200 nm while maintaining reliable operation of the transistor that is driven by the tunneling and/or hopping of single electrons and provide a relatively simple fabrication process where nanoparticles are formed in situ to form coulomb islands.

The source and drain regions may be formed by the application or vapor deposition of an electrically conductive material or the implantation of an impurity so that they are separated from one another by a predetermined distance and have a desirable shape. Application of the electrically conductive material may be performed by a printing process using electrically conductive ink. Non-limiting examples of this printing process include inkjet printing, screen printing, gravure printing and the like. Other options for deposition of the electrically conductive material include chemical vapor deposition, physical vapor deposition or thermal vapor deposition, which is generally used to fabricate electrodes in semiconductor manufacturing. The chemical vapor deposition may include plasma-assisted chemical vapor deposition. The material of the gate may be a metal; a metal alloy; an electrically conductive metal oxide; an electrically conductive metal nitride; a metal silicide; an electrically conductive polymer; an electrically conductive nanomaterial such as graphene or metallic carbon nanotubes; or a mixture thereof, but it is to be understood that the scope of the present disclosure is not limited by the material of the source and drain regions. When the substrate is, for example, a silicon (Si) substrate, the source and/or drain region may be made of Al, Cu, Ag, Au, Pt, Ti, TiN, TiAlN, Ta, TaN, W, WN, Pd, Zr, Ni, Co, Cr, Sn, Zn, ITO (indium tin oxide), or a mixture of two or more thereof, or an electrically conductive material such as polysilicon, electrically conductive polyacetylene, electrically conductive polyaniline, or electrically conductive 3,4-ethylenedioxythiophene. As described above, the channel region may be defined by the source and drain region, and in detail, the channel region may be a substrate surface between the source and drain regions, which are separated from and opposite to each other.

The gate 180 may have a single gate or dual gate structure. The gate 180 may also be disposed over the channel region 190.

FIGS. 2 to 6 are schematic views showing a method for forming a channel region for a single electron transistor according to an embodiment of the present disclosure.

Figure 4A:
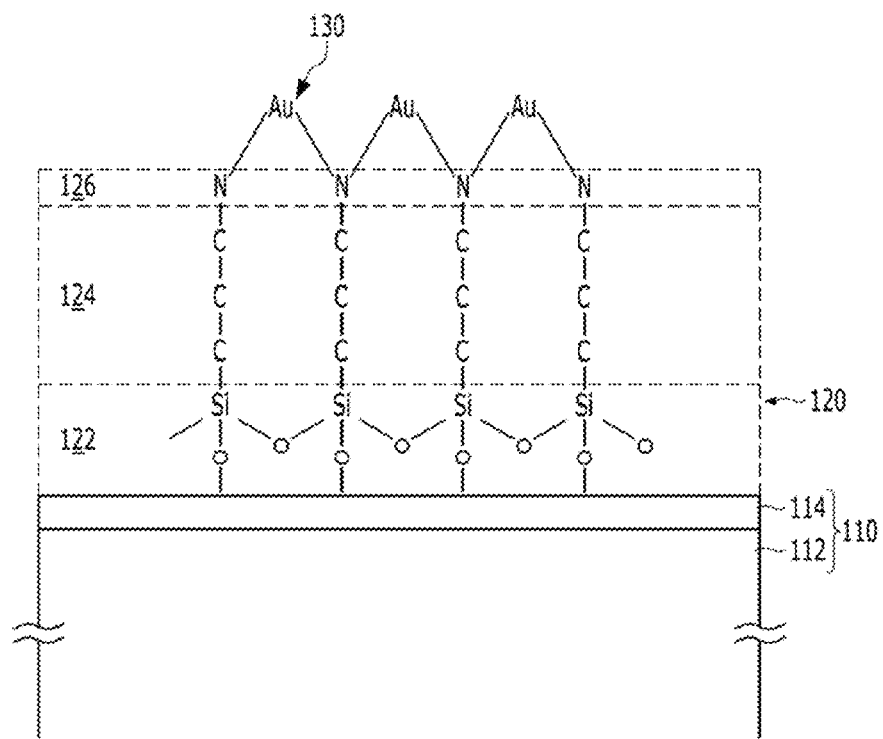
Figure 4B:
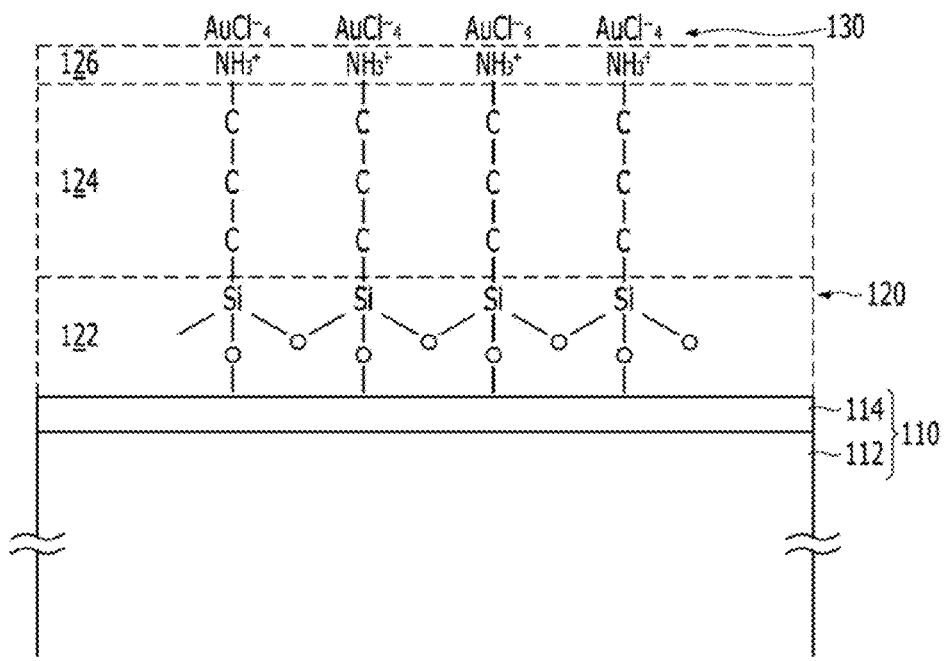
Figure 5:
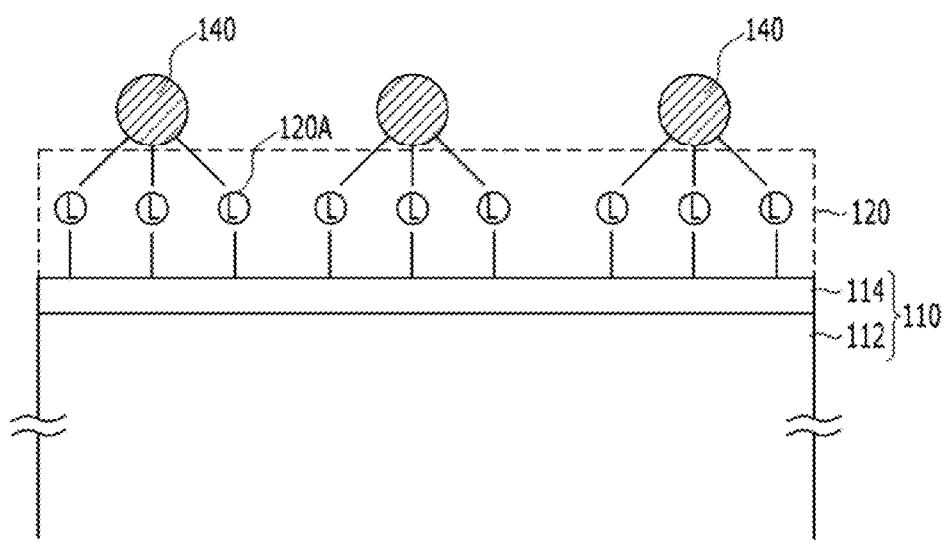

A method for forming a channel region of a single electron transistor according to an embodiment of the present disclosure may include providing a substrate 110 (see FIG. 2), bonding linkers 120A to the substrate 110 (see FIG. 3), bonding metal ions 130 to the linkers 120A (see FIGS. 4A and 4B), and forming metallic nanoparticles 140 from the metal ions 130 by application of energy (see FIG. 5). The method may further include supplying a dielectric organic material 150 to the structure having the metallic nanoparticles 140 formed thereon (see FIG. 6). Additionally, the method may further include supplying one or a plurality of organic surfactants before or during application of energy.

Figure 2:
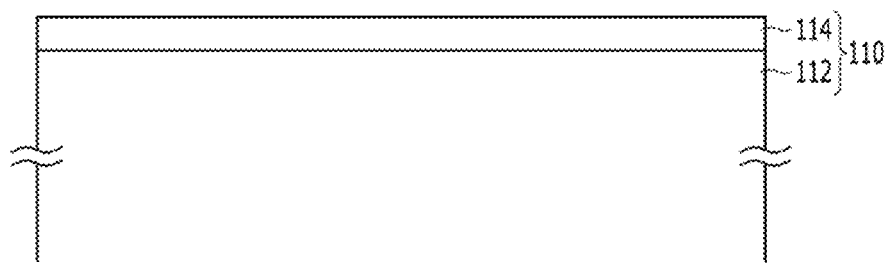
FIGS. 2 to 6 are schematic views showing a method for forming a channel region of a single electrode transistor in accordance with an embodiment of the present disclosure.

FIG. 2 shows a substrate 110. Referring to FIG. 2, the substrate 110 may have a surface layer 114 capable of being bonded with linkers. For example, the substrate 110 may be a silicon substrate 112 having silicon oxide ($SiO_2$) as the surface layer 114. The surface layer 114 may function as a gate dielectric layer that is formed between the gate and channel region of the single electron transistor.

The substrate 110 may be a semiconductor substrate or a flexible substrate. It may function as a physical support to any one of the source region, drain region and gate of the single electron transistor, or may be the raw material of these elements.

When viewed macroscopically, the substrate 110 may have the shape of a wafer or a film, and the surface thereof may be nanopatterned in view of the physical shape of a designed single electron transistor, such as a transistor having a recess structure or a three-dimensional structure.

The substrate 110 may be made of a semiconductor material, a ceramic material, a metal or a polymer, or may be a stack of two or more different layers that are selected from the above materials. Specific non-limiting examples of the stack include a stack of layers made of different materials, a stack of layers made of different ceramic materials, a stack of layers made of a semiconductor and a metal, and a stack of layers made of a semiconductor and a ceramic material.

Non-limiting examples of the semiconductor substrate include a substrate made of a material selected from among group 4 semiconductors, including silicon (Si), germanium (Ge) and silicon germanium (SiGe); a substrate made of a material selected from among group 3-5 semiconductors, including gallium arsenide (GaAs), indium phosphide (InP) and gallium phosphide (GaP); a substrate made of a material selected from among group 2-5 semiconductors, including cadmium sulfide (CdS) and zinc telluride (ZnTe); a substrate made of a material selected from among group 4-6 semiconductors, including lead sulfide (PbS); and a stack of two or more layers made of different materials selected from among these materials. Non-limiting examples of the ceramic material include a substrate made of a semiconductor oxide, a semiconductor nitride, a semiconductor carbide, a metal oxide, a metal carbide or a metal nitride, or a stack of two or more layers made of different materials selected from among these materials. Herein, examples of the semiconductor oxide, the semiconductor nitride or the semiconductor carbide may include group 4 semiconductors, group 3-5 semiconductors, group 2-6 semiconductors, group 4-6 semiconductors, and mixtures thereof.

Non-limiting examples of the metal substrate material include transition metals, noble metals, metals, and mixtures thereof. Herein, examples of the noble metals include Sc, Y, La, Ac, Ti, Zr, Hf, V, Nb, Ta, Cr, Mo, W, Mn, Te, Re, Fe, Ru, Os, Co, Rh, Ir, Ni, Pd, Pt, Cu, Ag, Au, and mixtures thereof, and examples of the metals include Li, Na, K, Rb, Cs, Fr, Be, Mg, Ca, Sr, Ba, Pa, Zn, Cd, Al, Ga, In, Tl, Ge, Sn, Pb, Sb, Bi, Po, and mixtures thereof.

Non-limiting examples of the material of the flexible polymer substrate include polyethylene terephthalate (PET), polyethylene naphthalate (PEN), polyimide (PI), polycarbonate (PC), polypropylene (PP), triacetyl cellulose (TAC), polyethersulfone (PES), polydimethylsiloxane (PDMS), and mixtures thereof.

When the substrate 110 is a flexible polymer substrate, the surface layer 114 of the substrate may be made of an organic material having a functional group (e.g., —OH functional group) capable of being bonded with the linkers.

The surface layer 114 may be a thin metal layer. The thickness of the thin metal layer may be about 100 nm or less, particularly 1-100 nm. If the thin metal layer has a very thin thickness of less than 1 nm, the uniformity of the thin layer may be reduced, and undesired regions where the thin layer is not formed may possibly be present in the channel region 190.

Figure 3:
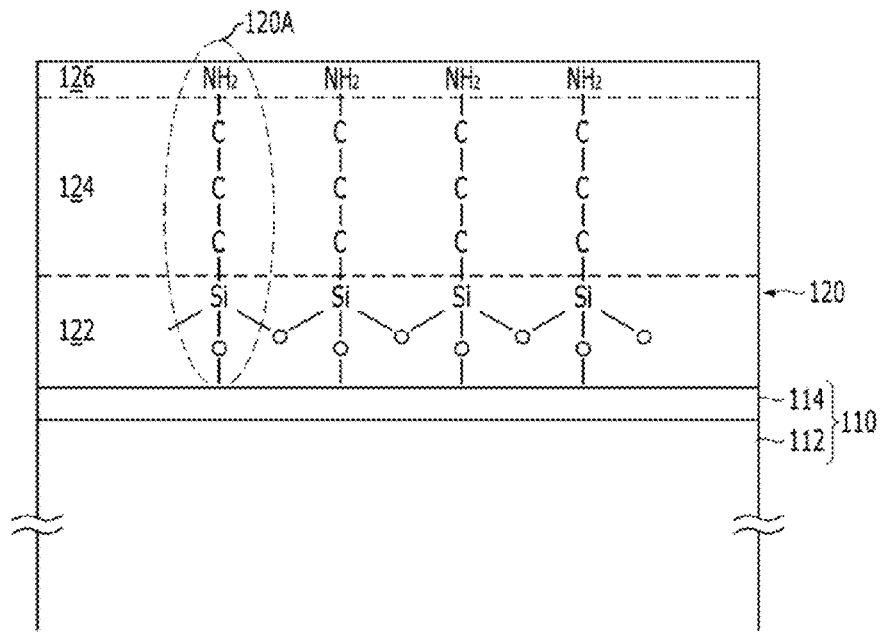

FIG. 3 shows a linker layer 120 formed on the substrate 110. The linker layer 120 may be composed of a plurality of linkers 120A. The linker layer 120 may be a self-assembled monomolecular layer bonded to the surface of the substrate 110.

The linkers 120A may be organic linkers chemically bonded to or adsorbed on the surface of the substrate 110 and may chemically bond with metal ions. Specifically, the linkers 120A may be organic linkers having both a functional group 122 that is chemically bonded to or adsorbed on the surface layer 114 of the substrate and a functional group 126 that is chemically bonded with metal ions (to be formed later). The chemical bond may include a covalent bond, an ionic bond, or a coordination bond. For example, the bond between metal ions and the linkers may be an ionic bond between positively charged (or negatively charged) metal ions and linkers that are negatively charged (or positively charged), at least at one end. For example, the bond between the surface layer of the substrate 110 and the linkers may be a bond caused by self-assembly or may be a spontaneous chemical bond between the functional group 122 of the linkers and the surface of the substrate.

More specifically, the linkers 120A may be organic monomolecules that form a self-assembled monomolecular layer. In other words, the linkers 120A may be organic monomolecules having both the functional group 122 that is bonded to the surface layer 114 and a functional group 126 capable of bonding with metal ions. The linkers 120A may include a chain group 124, which connects the functional group 122 with the functional group 126 and enables the formation of a monomolecular layer aligned by Van Der Waals interactions.

Self-assembly may be achieved by suitably designing the substrate surface, the first functional group 122 of the organic monomolecules, and a set of end groups with materials that are known to be self-assembling.

In a specific non-limiting embodiment, when the surface layer 114 of the substrate 110 is made of oxide, nitride, oxynitride or silicate, the organic monomolecule that is the linker may be a compound represented by the following Formula 1.

R1—C—R2     (Formula 1)

In Formula 1, R1 represents a functional group that bonds with the substrate, C represents a chain group, and R2 represents a functional group that bonds with metal ions. R1 may be one or more functional groups selected from the group including acetyl, acetic acid, phosphine, phosphonic acid, alcohol, vinyl, amide, phenyl, amine, acryl, silane, cyan and thiol groups. C is a linear or branched carbon chain having 1 to 20 carbon atoms. R2 may be one or more functional groups selected from the group including carboxylic acid, carboxyl, amine, phosphine, phosphonic acid and thiol groups.

In a non-limiting embodiment, the organic monomolecule that is the linker 120A may be one or more selected from among octyltrichlorosilane (OTS), hexamethyldisilazane (HMDS), octadecyltrichlorosilane (OLDrS), (3-aminopropyl)trimethozysilane (APS), (3-aminopropyl)triethoxysilane, N-(3-aminopropyl)-dimethyl-ethoxysilane (AP-DMES), perfluorodecyltrichlorosilane (PFS), mercaptopropyltrimethoxysilane (MPTMS), N-(2-aminoethyl)-3-aminopropyltrymethoxysilane, (3-trimethoxysilylpropyl)diethylenetriamine, octadecyltrimethoxysilane (OTMS), (heptadecafluoro-1,1,2,2-tetrahydrodecyl)trichlorosilane (FDTS), dichlorodimethylsilane (DDMS), N-(trimethoxysilylpropyl)ethylenediamine triacetic acid, hexadecanethiol (HDT), and epoxyhexyltriethoxysilan.

In terms of ensuring the stable isolation between the nanoparticles and the substrate, the organic monomolecule that is the linker may include an alkane chain group, particularly an alkane chain group having 3 to 20 carbon atoms, and may further include an oxygen-containing moiety. Examples of the oxygen-containing moiety include ethylene glycol (—O—CH$_2$—CH$_2$—), carboxylic acid (—COOH), alcohol (—OH), ether (—O—), ester (—COO—), ketone (—CO—), aldehyde (—COH) and/or amide (—NH—CO—), etc.

Attachment of the linkers 120A may be performed by bringing the substrate 110 into contact with a solution of the linkers 120A in a solvent. The solvent that is used to form the linker solution may be any solvent, which may dissolve the linkers and be easily removed by volatilization. As is known in the art, when the linker contains a silane group, water for promoting hydrolysis may be added to the linker solution. It is to be understood that the contact between the substrate and the linker solution may be performed using any known method that is generally used to form a self-assembled monomolecular layer on a substrate. In a non-limiting embodiment, the contact between the linker solution and the substrate may be performed using a dipping, micro contact printing, spin-coating, roll coating, screen coating, spray coating, spin casting, flow coating, screen printing, ink jet coating or drop casting method.

When metal ions are fixed to the substrate by the linkers 120A, there are advantages in that damage to the surface layer 114 of the substrate may be prevented, and a metal ion layer having metal ions distributed uniformly therein may be formed by self-assembly. Also, nanoparticles formed by application of energy may be stably fixed.

The linkers may be functional groups that chemically bond with metal ions. The surface of the substrate 110 may be modified to form a functional group (linker), and then a metal precursor may be supplied to the surface-modified substrate so that metal ions may bond with the a functional group. The functional group may be one or more selected from the group including carboxylic acid, carboxyl, amine, phosphine, phosphonic acid and thiol groups. Formation of the functional group on the substrate surface may be performed using any method. Specific examples of the method for forming the functional group on the substrate surface include plasma modification, chemical modification, and vapor deposition (application) of a compound having a functional group. Modification of the substrate surface may be performed by vapor deposition (application of a compound having a functional group) to prevent surface layer impurity introduction, quality deterioration, and damage.

In a specific non-limiting embodiment, when the surface material of the substrate 110 is oxide, nitride, oxynitride or silicate, a functional group (linker) may be formed by forming a silane compound layer on the substrate 110.

The silane compound layer may be made of an alkoxy silane compound having one or more functional groups selected from among carboxylic acid, carboxyl, amine, phosphine, phosphonic acid and thiol groups.

The silane compound may be represented by the following Formula 2:

$$R^1{}_n(R^2O)_{3-n}Si—R \quad \text{(Formula 2)}$$

In Formula 2, $R^1$ is hydrogen, a carboxylic acid group, a carboxyl group, an amine group, a phosphine group, a phosphonic acid group, a thiol group, or a linear or branched alkyl group having 1 to 10 carbon atoms; $R^2$ is a linear or branched alkyl group having 1 to 10 carbon atoms; R is a linear or branched alkyl group having 1 to 10 carbon atoms; the alkyl group in R may be substituted with one or more selected from among carboxylic acid, carboxyl, amine, phosphine, phosphonic acid and thiol groups; the alkyl group in $R^1$ and the alkyl group in $R^2$ may each be independently substituted with one or more selected from among halogen, carboxylic acid, carboxyl, amine, phosphine, phosphonic acid and thiol groups; and n is 0, 1 or 2.

The silane compound may be represented by one of the following Formulas 3 to 5:

$$(R^3)_3Si—R^4—SH \quad \text{(Formula 3)}$$

$$(R^3)_3Si—R^4—COOH \quad \text{(Formula 4)}$$

$$(R^3)_3Si—R^4—NH_2 \quad \text{(Formula 5)}$$

In the Formula 3, 4, and 5, $R^3$ groups are each independently an alkoxy or alkyl group and one or more $R^3$ groups are an alkoxy group; and $R^4$ is a divalent hydrocarbon group having 1 to 10 carbon atoms. Specifically, $R^3$ groups in Formula 3, 4 or 5 may be the same or different and may each be independently an alkoxy group, such as methoxy, ethoxy or propoxy, or an alkyl group; and $R^4$ may be a divalent hydrocarbon group having 1 to 20 carbon atoms, such as —CH$_2$—, —CH$_2$—CH$_2$—, —CH$_2$—CH$_2$—CH$_2$—, —CH$_2$—CH(CH$_3$)—CH$_2$— or —CH$_2$—CH$_2$—CH(CH$_3$)—.

Non-limiting examples of the carboxysilane compound include methyldiacetoxysilane, 1,3-dimethyl-1,3-diacetoxydisiloxane, 1,2-dimethyl-1,2-diacetoxydisilane, 1,3-dimethyl-1,3-dipropionoxydisilamethane, and 1,3-diethyl-1,3-diacetoxydisilamethane. Non-limiting examples of the aminosilane compound include N-(2-aminoethyl)aminopropyltri(methoxy) silane, N-(2-aminoethyl)aminopropyltri(ethoxy)silane, N-(2-aminoethyl)aminopropylmethyldi(methoxy)silane, N-(2-aminoethyl)aminopropylmethydi(ethoxy)silane, 3-aminopropyl tri(methoxy)silane, 3-aminopropyltri (ethoxy)silane, 3-aminopropylmethyidi (methoxy)silane, and 3-aminopropylmethyldi(ethoxy)silane. Non-limiting examples of the mercaptosilane compound include mercaptopropyltrimethoxysilane, mercaptopropyltriethoxysilane, mercaptoethyl trimethoxysilane, and mercaptoethyltriethoxysilane.

The above-described silane compound may be applied to or deposited on the surface of the substrate 110 to form a functional group (a functional group resulting from a silane compound layer). The silane compound layer may be formed by applying and drying a silane compound solution. Alternatively, the silane compound may be deposited by supplying a gaseous silane compound to the substrate surface.

As the silane compound functional group will react with a metal precursor to be supplied later so that metal ions may be fixed to the substrate, it is preferred to form the silane compound layer as a uniform layer in which the functional group is uniformly exposed to the surface. The silane compound layer may be formed by atomic layer deposition (ALD).

The above-described silane compound having a functional group, particularly the silane compound of Formula 2, and particularly the silane compounds of Formulas 3 and 4, 20) may belong to the above-described self-assembly molecule group. Specifically, $(R^3)_3Si$ may correspond to the functional group that is bonded to the substrate surface, $R^4$ may correspond to the chain group, and R (R in formula 2) such as —SH, —COOH or —NH$_2$ may correspond to the functional group that bonds with metal ions. The silane compound layer may be a monomolecular layer formed of the silane compound.

FIGS. 4A and 4B show metal ions 130 bonded to the linkers 120A. The metal ions 130 may be bonded to the functional group 126 of the linkers 120A.

The metal ions 130 may be formed by supplying a metal precursor to the substrate (having the linkers formed thereon). Specifically, the metal ions 130 may be formed by applying (or impregnating) a metal precursor solution to the substrate or applying a gaseous metal precursor to the substrate.

The metal precursor may be designed in view of the material of the desired nanoparticles. For example, the metal precursor may be precursors of one or more metals selected from among transition metals, post-transition metals, and metalloids. In a non-limiting embodiment, the transition metal precursor may be a transition metal salt. Specifically, the transition metal may be one or more selected from among Au, Ag, Ru, Pd and Pt, and the transition metal salt may be selected from among halides, chalcogenides, hydrochlorides, nitrates, sulfates, acetates or ammonium salts of the transition metal. When the transition metal of the transition metal precursor is Au, examples of the transition metal precursor include, but are not limited to, HAuCl$_4$, AuCl, AuCl$_3$, Au$_4$Cl$_8$, KAuCl$_4$, NaAuCl$_4$, NaAuBr$_4$, AuBr$_3$, AuBr, AuF$_3$, AuF$_5$, AuI, AuI$_3$, KAu(CN)$_2$, Au$_2$O$_3$, Au$_2$S, Au$_2$S$_3$, AuSe, Au$_2$Se$_3$, and the like.

The metal ions 130 that are bonded (attached) to the substrate by the linker 120A may be ions of one or more metals (elements) selected from among transition metals, post-transition metals, and metalloids. Depending on the kind of metal precursor, the metal ions 130 may be the above-described metal ions themselves or monomolecular ions including the above-described metals. Metal ions themselves may be bonded to the functional groups 126 of the organic monomolecules (linkers) (see FIG. 4A), or metal-containing monomolecular ions may be bonded to the second functional groups 126 of organic monomolecules (see FIG. 4B). Metal-containing monomolecular ions may be ions originating from the metal precursor (ions resulting from the reaction between the organic monomolecules and the functional groups).

FIG. 5 shows metallic nanoparticles 140 formed by the reduction and growth of the metal ions 130 by application of energy. The metallic nanoparticles 140 may be formed on the substrate 110 by the linkers 120A.

Advanced synthesis technology enables the synthesis of very fine nanoparticles including several tens to several hundreds of atoms, but in view of thermodynamics, synthesized nanoparticles may not have a uniform particle size distribution, and the difference in size between the nanoparticles may increase as the size of the reaction field during synthesis increases. In addition, a method of preparing nanoparticles by etching using a top-down process enables the preparation of particles having a size of 20 nm or less by advanced lithography, but it is difficult to apply commercially because the process is complicated and precise control is required.

However, in a preparation method according to an embodiment of the present disclosure, nanoparticles are prepared directly in a very small reaction field corresponding to the surface region of the substrate, and thus nanoparticles having a very uniform and finely controlled size may be formed at high density. Because nanoparticles are formed by fixing metal ions to the substrate by the linkers and then applying energy to the metal ions, the nanoparticles may be produced within a short time in a simple, easy and cost-effective manner. Further, because nucleation and growth (formation of nanoparticles) are induced by application of energy in a state in which metal atoms (ions) are fixed to the substrate by the linkers, the migration of the metal atoms (ions) may be uniformly controlled resulting in the formation of more uniform and fine nanoparticles. A metal material to be used for nucleation and growth to form nanoparticles may be supplied only by the metal atoms (ions) bonded to the linkers. In other words, the supply of a material used to form nanoparticles comes from the diffusion of the metal atoms (ions) bonded to the linkers. Due to bonding of the metal atoms (ions) to the linkers, the metal atoms (ions) have difficulty in migrating beyond a predetermined distance to participate in nucleation and growth, and thus the reaction field of each nanoparticle may be limited to around the nucleus. Thus, nanoparticles having a more uniform and finer size may be formed on the substrate at high density, and the separation distance between the formed nanoparticles may also be uniform. In addition, bonding of the metallic nanoparticles to the linkers is maintained, and thus the nanoparticles may be stably fixed to the substrate by the linkers. Also, the separation distance between the nanoparticles may correspond to the diffusion distance of the metal atoms that participate in the nucleation and growth of the nanoparticles.

Energy that is applied to form the nanoparticles may be one or more selected from among heat energy, chemical energy, light energy, vibration energy, ion beam energy, electron beam energy, and radiation energy.

Thermal energy may include Joule heat. Thermal energy may be applied directly or indirectly. Direct application of thermal energy may be performed in a state in which a heat source and the substrate having metal ions fixed thereto come into physical contact with each other. Indirect application of thermal energy may be performed in a state in which a heat source and the substrate having metal ions fixed thereto do not come into physical contact with each other. Non-limiting examples of direct application include a method that includes placing a heating element, which generates Joule heat by the flow of electric currents, beneath the substrate, and transferring thermal energy to the metal ions through the substrate. Non-limiting examples of indirect application include a method that uses a conventional heat-treatment furnace with a space in which an object (such as a tube) to be heat-treated is placed, a heat insulation material that surrounds the space to prevent heat loss, and a heating element placed inside the heat insulation material. A non-limiting example of indirect heat application is seen in the method of placing a heating element at a predetermined distance above the substrate, where the metal ions are fixed, and transferring thermal energy to the metal ions through a fluid (including air) present between the substrate and the heating element.

Light energy may include light having the wavelength range from deep ultraviolet to far infrared, and application of light energy may include irradiation with light. In a non-limiting embodiment, a light source may be placed above the substrate, where the metal ions are fixed, at a predetermined distance from the metal ions, and light from the light source may be irradiated onto the metal ions.

Vibration energy may include microwaves and/or ultrasonic waves. Application of vibration energy may include irradiation with microwaves and/or ultrasonic waves. In a non-limiting embodiment, a microwave and/or ultrasonic wave source may be placed above the substrate having the metal ions fixed thereto, at a predetermined distance from the metal ions, and microwaves and/or ultrasonic waves from the source may be irradiated onto the metal ions.

Radiation energy may include one or more selected from among α rays, β rays and γ rays and may be β rays and/or γ rays in terms of reduction of the metal ions. In a non-limiting embodiment, a radiation source may be placed above the substrate, having the metal ions fixed thereto, at a predetermined distance from the metal ions, and radiation from the source may be irradiated onto the metal ions.

Kinetic energy may include the use of a particle beam and the particle beam may include an ion beam and/or an electron beam. The ions of the beam may be negatively charged ions. In a non-limiting embodiment, an ion or electron source may be placed above the substrate having the metal ions fixed thereto, at a predetermined distance from the metal ions, and an ion beam and/or electron beam may be applied to the metal ions using an accelerating element that provides an electric field (magnetic field) that accelerates ions or electrons in the direction of the metal ions.

Chemical energy is the Gibbs free energy difference between before and after a chemical reaction, and the chemical energy may include reduction energy. Chemical energy may include the energy of a reduction reaction with a reducing agent and may mean the energy of a reduction reaction in which the metal ions are reduced by the reducing agent. In a non-limiting embodiment, application of chemical energy may be a reduction reaction in which the reducing agent is brought into the substrate having the metal ions fixed thereto. Herein, the reducing agent may be supplied in the liquid or gaseous state.

In a fabrication method according to an embodiment of present disclosure, application of energy may include simultaneously or sequentially applying two or more selected from among heat energy, chemical energy, light energy, vibration energy, ion beam energy, electron beam energy and radiation energy.

In a specific embodiment of simultaneous application, application of heat may be performed simultaneously with application of a particle beam. The particles of the particle beam may be heated by heat energy. In another specific embodiment of simultaneous application, application of heat may be performed simultaneously with application of a reducing agent. In still another embodiment of simultaneous application, application of a particle beam may be performed simultaneously with application of infrared rays or with application of microwaves.

Sequential application may mean that one kind of energy is applied, followed by application of another kind of energy. It may also mean that different kinds of energy are continuously or discontinuously applied to the metal ions. It is preferable that reduction of the metal ions fixed to the substrate by the linkers be performed before formation of nanoparticles, and thus in a specific embodiment of sequential application, heat may be applied after addition of a reducing agent or after application of a positively charged particle beam.

In a non-limiting practical embodiment, application of energy may be performed using a rapid thermal processing (RTP) system, including a tungsten-halogen lamp, and the rapid thermal processing may be performed at a heating rate of 50 to 150° C./sec. The rapid thermal processing may be performed in a reducing atmosphere or an inert gas atmosphere.

In a non-limiting practical embodiment, application of energy may be performed by bringing a solution of a reducing agent in a solvent into contact with the metal ions, followed by thermal processing using the rapid thermal processing system in a reducing atmosphere or an inert gas atmosphere.

In a non-limiting practical embodiment, application of energy may be performed by generating an electron beam from an electron beam generator in a vacuum chamber and accelerating the generated electron beam to the metal ions. Herein, the electron beam generator may be of a square type or a linear gun type. The electron beam may be produced by generating plasma from the electron beam generator and extracting electrons from the plasma using a shielding membrane. In addition, it is to be understood that a heating element may be provided on a holder for supporting the substrate in the vacuum chamber, and heat energy may be applied to the substrate by this heating element before, during and/or after application of the electron beam.

When the desired nanoparticles are metal nanoparticles, the metal nanoparticles may be formed in situ by application of energy as described above. When the nanoparticles to be prepared are not metal nanoparticles, but are metal compound nanoparticles, the metal compound nanoparticles may be prepared by supplying an element different from the metal ions during or after application of the above-described energy. Specifically, the metal compound nanoparticles may include metal oxide nanoparticles, metal nitride nanoparticles, metal carbide nanoparticles or intermetallic compound nanoparticles. More specifically, the metal compound nanoparticles may be prepared by supplying a different element in the gaseous or liquid state during or after application of the above-described energy. In a specific embodiment, metal oxide nanoparticles in place of metal nanoparticles may be prepared by supplying an oxygen source, including oxygen gas during application of energy, and metal nitride nanoparticles in place of metal nanoparticles may be prepared by supplying a nitrogen source, including nitrogen gas, during application of energy. Metal carbide nanoparticles may be prepared by supplying a carbon source, including $C_1$-$C_{10}$ hydrocarbon gas during application of energy, and intermetallic compound nanoparticles may be prepared by supplying a precursor gas containing a different element, which provides an intermetallic compound during application of energy. Specifically, the intermetallic compound nanoparticles may be prepared by carbonizing, oxidizing, nitrifying or alloying the metal nanoparticles prepared by application of the above-described energy.

The density of nanoparticles (the number of nanoparticles per unit surface area of the channel region) and the particle size and particle size distribution of nanoparticles may be controlled by one or more factors selected from the energy application conditions, including the kind, magnitude, temperature, and duration of application of energy.

The nanoparticles formed preferably have a very small average particle radius of about 0.5-1 nm, and the standard deviation of the particle radius is preferably ±20% or less, indicating that the nanoparticles have a very uniform particle size distribution. In addition, the number of nanoparticles formed per unit area of the channel region, that is, the density of nanoparticles formed is preferably about $0.2 \times 10^{14}$/cm$^2$ to $2.0 \times 10^{14}$/cm$^2$. In a specific embodiment for achieving such properties, when energy to be applied is an electron beam, the electron beam may be irradiated at a dose of 1 µGy to 100 KGy, preferably about 1 µGy to 50 KGy, more preferably 0.001 to 20 KGy, even more preferably 0.01 to 10 KGy, and most preferably 0.05 to 5 KGy. When energy to be applied is heat energy, fine and uniform nanoparticles may be formed either by performing heat treatment in a reducing atmosphere at a temperature of 100~500° C. for 0.1-4 hours or by supplying a reducing agent to the metal ions bonded to the linkers and performing heat treatment in an inert atmosphere at a temperature of 100~500° C. for 0.1-4 hours. In other words, heat energy may be applied in a reducing atmosphere, or chemical energy and heat energy may be sequentially applied. When heat energy is applied in a reducing atmosphere, the reducing atmosphere may contain hydrogen. In a specific embodiment, the reducing atmosphere may be an inert gas containing 1-5 mole % of hydrogen. In terms of providing uniform reduction, heat energy may be applied in an atmosphere in which a reducing gas flows. In a specific embodiment, the atmosphere may have reducing gas flowing at a flow rate of 10-100 cc/min. When chemical energy and heat energy are to be sequentially applied, a reducing agent may be brought into contact with the metal ions, followed by application of heat energy in an inert atmosphere. The reducing agent may be any compound that reduces the metal ions into a metal. When chemical energy is applied by addition of the reducing agent, transition metal nanoparticles may also be formed by a reduction reaction. When nanoparticles are to be formed from the metal ions by a reduction reaction, the reduction reaction should occur very rapidly and uniformly throughout the channel region so that transition metal particles having a more uniform size may be formed. A strong reducing agent may be used, and in a preferred embodiment, the reducing agent may be $NaBH_4$, $KBH_4$, $N_2H_4H_2O$, $N_2H_4$, $LiAlH_4$, $HCHO$, $CH_3CHO$, or a mixture of two or more thereof. The contact between the metal ions and the reducing agent may be achieved either by applying a solution of the reducing agent in a solvent to the channel region, or by impregnating the substrate with a solution of the reducing agent in a solvent, or by supplying the reducing agent in the gaseous phase to the substrate. In a specific non-limiting embodiment, the contact between the reducing agent and the metal ions may be performed at room temperature for 1-5 hours.

As described above, the nucleation and growth of transition metal nanoparticles may be controlled by one or more factors selected from among the kind, magnitude, and time of energy application.

In a fabrication method according to an embodiment of the present disclosure, the size of nanoparticles may be controlled by supplying an organic surfactant that is to be bonded to or adsorbed on the metal ions, followed by application of energy. Otherwise, the size of nanoparticles may be controlled during the growth thereof by supplying an organic surfactant that is to be bonded to or adsorbed on the metal ions during application of energy. This supply of the organic surfactant may be optionally performed during the fabrication process. The organic surfactant applied before or during energy application may include one or more organic surfactants.

To more effectively inhibit the mass transfer of the metal ions, a first organic material and a second organic material that are different from each other, may be used as the surfactant.

The first organic material may be a nitrogen- or sulfur-containing organic compound. The sulfur-containing organic material may include a linear or branched hydrocarbon compound having a thiol group at one end. In a specific example, the sulfur-containing organic compound may be one or more selected from among $HS-C_n-CH_3$ (n: an integer ranging from 2 to 20), n-dodecyl mercaptan, methyl mercaptan, ethyl mercaptan, butyl mercaptan, ethylhexyl mercaptan, isooctyl mercaptan, tert-dodecyl mercaptan, thioglycolacetic acid, mercaptopropionic acid, mercaptoethanol, mercaptopropanol, mercaptobutanol, mercaptohexanol and octyl thioglycolate.

The second organic material may be a phase-transfer catalyst-based organic compound, for example, quaternary ammonium or a phosphonium salt. More specifically, the second organic surfactant may be one or more selected from among tetraocylyammonium bromide, tetraethylammonium, tetra-n-butylammonium bromide, tetramethylammonium chloride, and tetrabutylammonium fluoride.

The organic surfactant that is applied before or during application of energy may be bonded to or adsorbed on the nuclei of metal ions or the metal ions bonded to the linkers, and the nucleation and growth of nanoparticles by energy applied may be controlled by the organic surfactant that is bonded to or adsorbed on the metal ions. This organic surfactant makes it possible to inhibit the mass transfer of the metal ions during application of energy, thereby forming more uniform and finer nanoparticles. Because the metal ions bond with the organic surfactant, these metal ions require higher activation energy compared to when they diffuse in order to participate in nucleation or growth, or the diffusion thereof is physically inhibited by the organic surfactant. Thus, the diffusion of the metal atoms (ions) may become slower and the number of the metal atoms (ions) that participate in the growth of nuclei may be decreased.

The process of applying energy in the presence of the organic surfactant may include, before application of energy, applying a solution of the organic surfactant to the channel region (i.e., the substrate surface having the metal ions bonded thereto by the linkers) or supplying the organic surfactant in the gaseous state to the channel region. Alternatively, it may include, together with application of energy, applying a solution of the organic surfactant to the channel region having the metal ions formed therein or supplying the organic material in the gaseous state to the channel region to bond or adsorb the organic surfactant to the metal nuclei. Alternatively, it may include, during application of energy, applying a solution of the organic surfactant to the channel region having the metal ions formed therein or supplying the organic material in the gaseous state to the channel region to bond or adsorb the organic surfactant to the metal nuclei. Alternatively, it may include, after application of energy for a predetermined period of time and without application of energy, applying a solution of the organic surfactant to the channel region having the metal ions formed therein or supplying the organic material in the gaseous state to the channel region to bond or adsorb the organic surfactant to the metal nuclei, followed by re-application of energy.

In a fabrication method according to an embodiment of the present disclosure, energy may be applied to the entire area or a portion of the region having the metal ions bonded thereto. When energy is applied to a portion of the region, energy may be irradiated in a spot, line or predetermined plane shape. In a non-limiting embodiment, energy may be applied (irradiated) in spots while the metal ion-bonded region may be entirely scanned. Application of energy to a portion of the metal ion-bonded region may include not only when energy is irradiated in a spot, line, or plane shape while the metal ion-bonded region is entirely scanned, but also when energy is applied (irradiated) only to a portion of the metal ion-bonded region. As described above, a pattern of nanoparticles may be formed by applying energy to a portion of the channel region. In other words, application (irradiation) of energy to a portion of the channel region makes it possible to form a pattern of nanoparticles. Energy may be irradiated onto a patterned region of the channel region and a pattern of metallic nanoparticles may be formed in the channel region. In a non-limiting embodiment of patterning, energy may be discontinuously applied to the channel region in the lengthwise direction of the channel region (i.e., the direction from the source region to the drain region) to form a pattern of nanoparticles which is discontinuous in the lengthwise direction of the channel region. This is based on the embodiment of the present disclosure in which nanoparticles are formed in situ in the channel region by application of energy. In this case, energy is applied only to a portion of the channel region in which nanoparticles are to be formed, whereby a particle region and a non-particle region may coexist in the channel region in a specific pattern.

Figure 6:
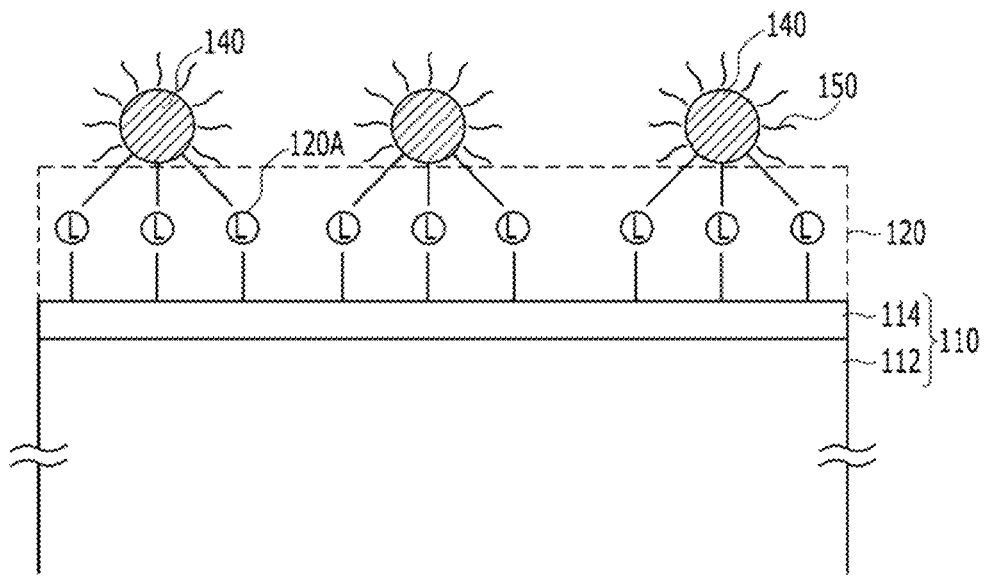

FIG. 6 shows a dielectric organic material 150 bonded to the metallic nanoparticles 140 grown by application of energy. The dielectric organic material 150 may be in a state in which it is coated on the surface of the metallic nanoparticles 140 or fills the gaps between the metallic nanoparticles 140. The dielectric organic material 150 may provide isolation between the nanoparticles to more reliably prevent the flow of current between the nanoparticles.

If a sufficient amount of the organic surfactant was supplied in the preceding action, that is, if the organic surfactant that is applied before or during application of energy remains on the surface of the grown nanoparticles to provide sufficient isolation between the grown nanoparticles, the dielectric organic material 150 does not need to be added to the surface of the grown nanoparticles 140. In other words, because whether the organic material is to be used before or during application of energy (or the supply or kind of organic material, etc.) is determined according to the size of nanoparticles to be formed, the formation of the dielectric organic material 150 is optional.

Supply of the dielectric organic material 150 may be performed by applying a solution of the dielectric organic material to the nanoparticle layer formed by application of energy, and then drying the applied solution, thereby filling the dielectric organic material into the gap between the nanoparticles. This may provide a structure in which the nanoparticles are embedded in a dielectric matrix made of the dielectric organic material. The dielectric organic material that is used in the present disclosure may be any conventional dielectric material that is used to form dielectric layers in conventional organic-based electronic devices. Specific examples of the dielectric organic material include, but are not limited to, benzocyclobutene (BCB), acrylic compounds, polyimide, polymethylmethacrylate (PMMA), polypropylene, fluorinated compounds (e.g., CYTOPTM), polyvinyl alcohol, polyvinyl phenol, polyethylene terephthalate, poly-p-xylylene, cyanopulluane (CYMM) and polymethylstyrene.

The dielectric organic material 150 may be a substance that spontaneously bonds with a metal. In other words, after formation of nanoparticles by application of energy has been performed, the dielectric organic material may be bonded with the metal of the nanoparticles (i.e., the metal of the metal ions attached to the substrate by the linkers) either by applying to the channel region a solution of the dielectric organic material that spontaneously bonds with the metal of the metal ions attached to the substrate by linkers, or by supplying the dielectric organic material in the gaseous state to the channel region, thereby forming composite nanoparticles having a core-shell structure including nanoparticle cores and dielectric shells. According to this method, a very uniform dielectric layer may be formed on fine nanoparticles, and more reliable isolation between the nanoparticles may be ensured.

The dielectric organic material 150 that is used in the present disclosure may be any dielectric material having a functional group that bonds with the metal contained in the nanoparticles. In a specific embodiment, the dielectric organic material that spontaneously bonds with the metal contained in the nanoparticles may include, at one end, a functional group such as a thiol group (—SH), a carboxyl group (—COOH) and/or an amine group (—NH$_2$) that may spontaneously form a chemical bond with the metal contained in the nanoparticles, and at the other end, a functional group such as a methyl group that does not react with the metal contained in the nanoparticles, and as the backbone, an alkane chain that enables the formation of a uniform dielectric layer. Herein, the thickness of the dielectric layer (shell) may be controlled by the carbon number of the alkane chain, and the dielectric organic material may have a $C_3$-$C_{20}$ alkane chain.

In order to more securely fix the nanoparticles 140 having the dielectric organic material 150 formed thereon, a layer of an inorganic oxide may additionally be formed. In addition, the inorganic oxide layer may be formed directly on the nanoparticles without the dielectric organic material. The organic oxide layer may be formed by a conventional vapor deposition method.

In a fabrication method according to an embodiment of the present disclosure, the weight ratio between the metallic nanoparticles and the dielectric organic material in the channel region may be about 1:0.5 to 5. This weight ratio between the transition metal nanoparticles and the dielectric organic material may provide a more stable tunneling barrier and enables current leakage to be prevented while it may also allow the operation of the transistor to be smoothly controlled by a gate voltage. This weight ratio between the nanoparticles and the dielectric organic material may be controlled by controlling the amount of dielectric organic material that is supplied to the channel region having the nanoparticles formed therein. In addition, when a dielectric organic material spontaneously bonds with metal atoms present on the surface of the nanoparticles, the weight ratio between the nanoparticles and the dielectric material may also be controlled by the carbon number of the alkane chain of the dielectric organic material, as described above.

Hereinafter, an experimental example will be described in which samples having nanoparticles formed therein and the observation of the nanoparticles in the samples is performed.

EXPERIMENTAL EXAMPLE

A substrate (hereinafter referred to as the $SiO_2$ substrate) having an amorphous $SiO_2$ oxide layer formed on a monocrystalline Si wafer to a thickness of 5-50 nm was prepared, and then washed ultrasonically three times in distilled water for 15 minutes and twice in ethanol for 30 minutes. Then, the substrate was placed in the chamber of an ALD (atomic layer deposition) system, after which a silane layer (linker layer) was deposited thereon using a precursor of 3-aminopropylmethyldi(ethoxy)silane. Specifically, a unit process of performing layer deposition using the supplied 3-aminopropylmethyldi(ethoxy)silane precursor for 1 second at 25° C. and a pressure of 0.4 Torr and purging the chamber with argon gas for 5 seconds was repeated 1-10 times, thereby depositing a 3-aminopropylmethyldi(ethoxy)silane layer on the $SiO_2$ substrate. Next, the $SiO_2$ substrate having formed thereon the 3-aminopropylmethyldi(ethoxy)silane layer having an amine functional group on the surface was immersed in a container containing 10 mL of 1 mM $KAuCl_4$ aqueous solution for 6 hours, thereby bonding Au ions to the amine group. Then, the $SiO_2$ substrate having Au ions bonded thereto by the 3-aminopropylmethyldi(ethoxy)silane was immersed in 1.0 mL 1 M $NaBH_4$ aqueous solution at 0° C. to chemically reduce the Au ions. After the chemical reduction, the recovered substrate was placed in a rapid thermal processing (RTP) system, and then thermally treated in an argon (Ar) atmosphere at 200~450° C. for 1 hour, thereby forming gold nanoparticles. Then, the substrate having the gold nanoparticles formed thereon was immersed in 10 mL of a solution of 5 mM hexanethiol in toluene, thereby forming a dielectric organic material surrounding the surface of the gold nanoparticles.

Figure 7:
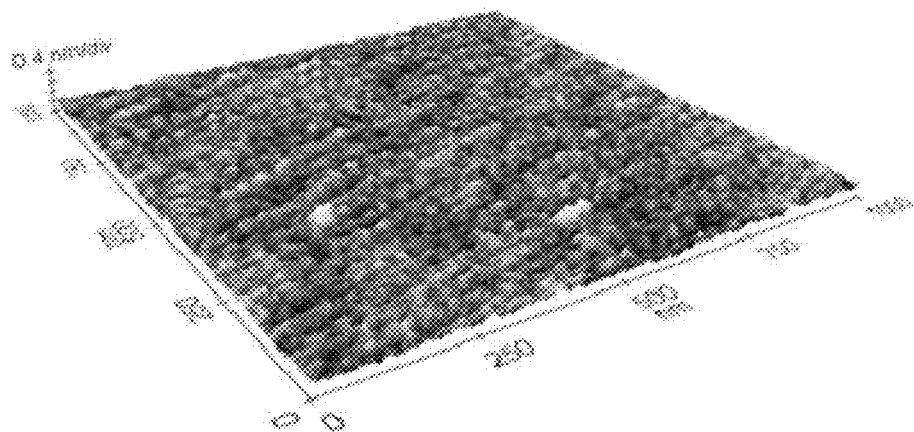
FIG. 7 shows AFM images of the surface of a substrate before surface modification (A), the surface of a substrate after surface modification (B), and the surface of a substrate after chemical reduction (C), obtained during exemplary fabrication of a channel region.
Figure 7:
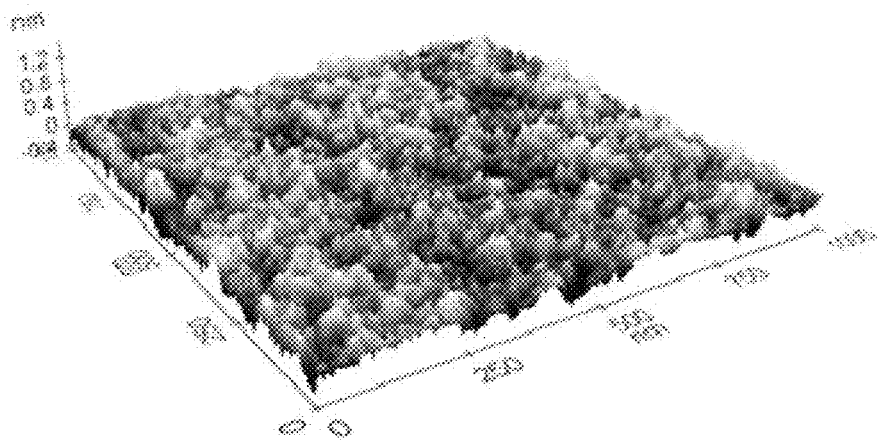
Figure 7:
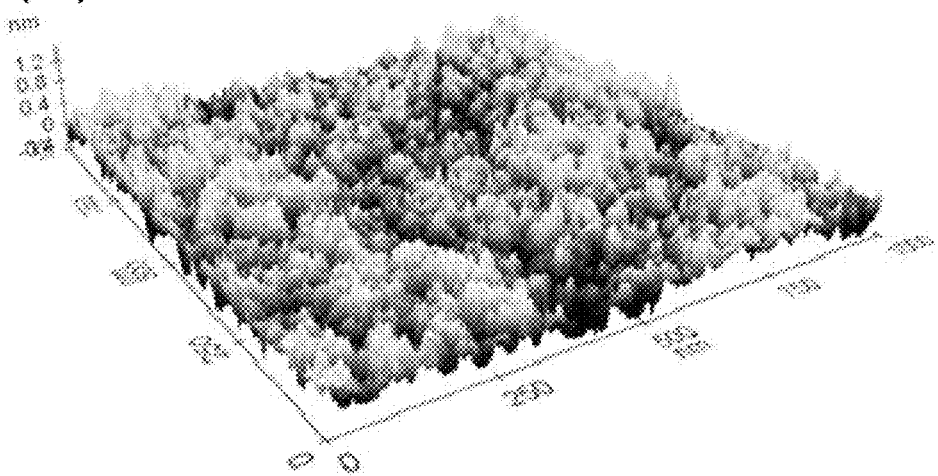

FIG. 7 is a set of AFM (atomic force microscope) images showing the surface roughness of the $SiO_2$ substrate obtained in each action of the fabrication process described in the above experimental example. FIG. 7(A) is an AFM image of the surface of the $SiO_2$ substrate immediately after washing, which was determined to have a surface roughness of 0.08 nm RMS. FIG. 7(B) is an AFM image of the surface of the $SiO_2$ substrate after performing the ALD process once using 3-aminopropylmethyldi(ethoxy)silane. As may be seen therein, after deposition of 3-aminopropylmethyldi(ethoxy)silane, the level of the surface of the substrate increased, the surface roughness was 0.12 nm RMS, which indicates a flat surface, and a layer of 3-aminopropylmethyldi(ethoxy)silane was uniformly deposited on the surface of the substrate. FIG. 7(C) is an AFM image of the surface of the substrate, obtained after reacting the gold precursor $KAuCl_4$ with the substrate having formed thereon the silane layer to bond Au ions to the functional group (amine group) of the silane layer and chemically reducing the bonded Au ions with $NaBH_4$. As may be seen in FIG. 7(C), the surface roughness of the substrate surface was 0.25 nm RMS after the chemical reduction, and gold nanoparticles having a particle diameter of 1 nm or less were formed by the chemical reduction.

A change in the wettability of the $SiO_2$ substrate surface-modified with 3-aminopropylmethyldi(ethoxy)silane was measured by contact angle. The measurement of contact angle was carried out by a half-angle method using the Young equation. The results of the contact angle measurement indicated that the contact angle of the surface of the $SiO_2$ substrate before washing was 50.3°, and the contact angle of the surface of the $SiO_2$ substrate after washing was 31.1°, suggesting that the substrate was changed to a highly hydrophilic surface after washing with ethanol compared to before washing. In addition, the contact angle of the surface of the $SiO_2$ substrate after deposition of 3-aminopropylmethyldi(ethoxy)silane was 58.9°, suggesting that the surface is a hydrophobic surface.

To analyze the surface charge distribution, the zeta potential of the substrate surface was measured using a zeta-potential measurement system. As a result, the zeta potentials of the substrate surface before and after deposition of 3-aminopropylmethyldi(ethoxy)silane were −20 mV and 0 mV, respectively, at a pH of 7. Thus, it may be seen that the $SiO_2$ surface having a negative charge at a pH of 7 was changed to a neutral surface as a result of uniform deposition of 3-aminopropylmethyldi(ethoxy)silane on the $SiO_2$ surface.

Figure 8:
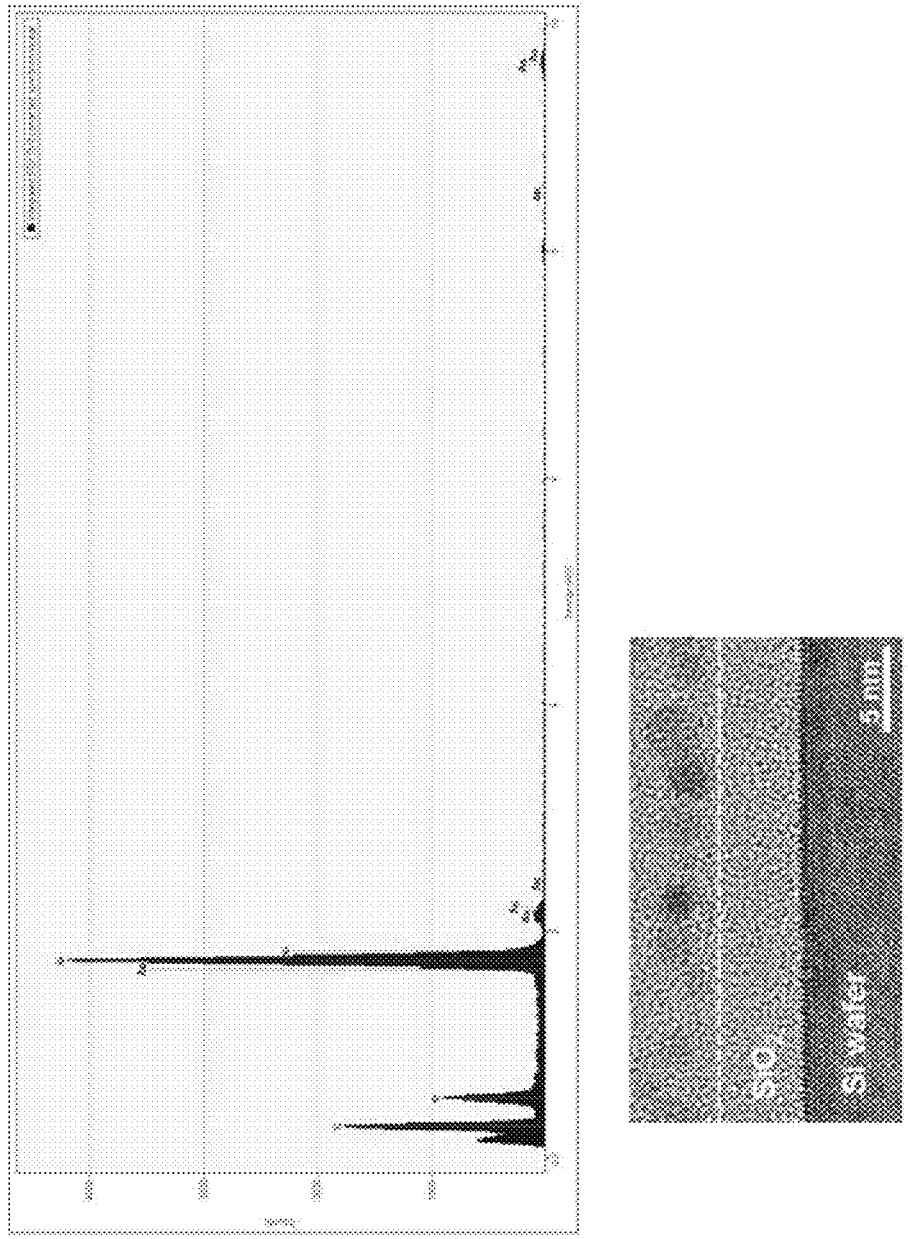
FIG. 8 shows the results of transmission electron microscopy and elementary analysis of gold nanoparticles formed on a substrate after RTP processing in exemplary fabrication of a channel region.

FIG. 8 shows a transmission electron micrograph (right) of gold nanoparticles after RTP processing and the results of energy dispersive X-ray spectroscopy (EDS) (left) performed to analyze the element of the gold nanoparticles. As may be seen in FIG. 8, spherical gold nanoparticles having a particle diameter of 1.8 nm were formed.

When growing nanoparticles by partially applying energy to a channel region, patterned nanoparticles may be formed. Such patterning of nanoparticles may be realized by a fabrication method according to another embodiment of the present disclosure. Patterning of nanoparticles in a channel region may be implemented by forming linkers on a substrate in the channel region. Linkers are not actually formed over the entire channel region. Instead, linkers are formed in a predetermined pattern, metal ions are bonded to the linkers, and energy is applied, by which patterning of metallic nanoparticles may be implemented. By this process a plurality of metallic nanoparticles may have a uniform pattern arrangement in the channel region.

Figure 9A:
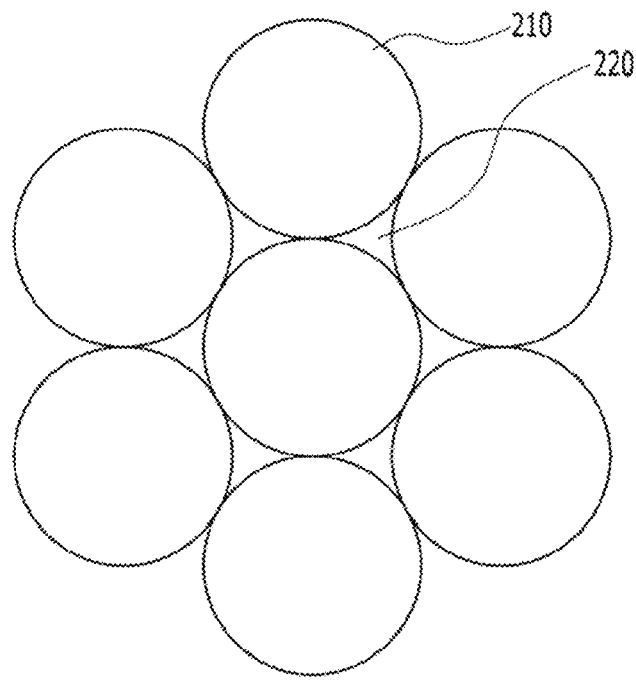
FIGS. 9A and 9B are plan views showing a method for forming metallic nanoparticles patterned in a channel region, by using a porous mask.
Figure 9B:
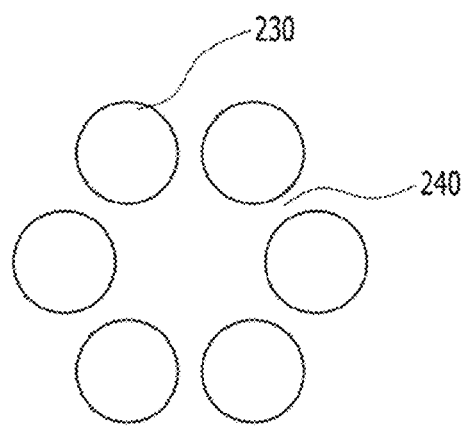

FIGS. 9A and 9B are plan views showing a method for forming metallic nanoparticles patterned in a channel region by using a porous mask. FIG. 9A is a plan view showing a porous mask 210, which is formed on a substrate and has a plurality of pores 220. FIG. 9B is a plan view showing a state in which metallic nanoparticles 230 are formed on the substrate channel region, which is exposed by the pores 220 of the porous mask 210. In FIG. 9B, the region excluding the nanoparticles 230 is a dielectric region 240 in which, for example, a dielectric organic material is formed.

A single electron transistor is determined in terms of whether it may be operated by migration of a single electron. When considering that the channel length of the transistor is determined by the separation distance of a source and a drain, in order to ensure that the source and the drain has an appropriate separation distance to be reproducibly realized by an already-developed printing method or a deposition method and the operational reliability of the transistor is not degraded, the channel length may be 5 nm to 200 nm. When considering such channel length, the porous mask 210 may use nanobeads of a single layer.

While nanobeads themselves may prevent bonding between linkers and the surface of a substrate, the material of nanobeads may be a material capable of bonding with linkers. Therefore, in order to stably perform patterning of nanoparticles, a nanoparticle pattern region may be defined in the channel region by forming another mask (a second mask) on the single layer of nanobeads and then removing the nanobeads. In other words, nanoparticles may be formed in the region, which is defined by the second mask. The material of the second mask may be selected according to the surface layer of the substrate.

If the surface layer of the substrate is a material, which may spontaneously bond with the linkers, a material, which does not spontaneously bond with the linkers, for example, organic silane, may be used as the material of the second mask. Conversely, if the surface layer of the substrate is a material, which does not spontaneously bond with the linkers, a material, which may bond with the linkers, may be used as the material of the second mask.

The removal of the nanobeads after forming the second mask may be performed by physical vibration such as ultrasonic waves or a physical force such as blowing including an air gun.

The single layer of nanobeads may be formed by applying or coating a bead dispersing liquid to the channel region of the substrate and removing the liquid phase of the dispersing liquid. The application of the beads may use a method generally used in a microbead lithography process. In a concrete example, the application or coating of the bead dispersing liquid may be performed by at least one method selected among spin coating, dip coating, lifting-up, electrophoretic deposition, chemical or electrochemical deposition and electrospray.

The size of the nanobeads may be controlled appropriately in consideration of the length of the channel and patterning to be designed. In a concrete example, the average diameter of the nanobeads may be about 1 nm to 5 nm. As for the material of the nanobeads, a bead material used in a general microbead lithography process may be used.

The organic silane may include any one or a mixture of at least two selected from among octyltrichlorosilane (OTS), octadecyltrimethoxysilane (OTMS), octadecyltriethoxysilane (OTE), octadecyl trichlorosilane, trimethoxy-propylsilane, perfluorooctyltrichlorosilane, dichlorodimethylsilane, undecyltrichlorosilane, undecenyltrichlorosilane, perfluorodecyltrichlorosilane, trichlorovinylsilane, pentyltrichlorosilane (PETCS), phenyltrichlorosilane (PTCS), benzyltrichlorosilane (BZTCS), trichlorosilane (TCS), 4-biphenyltrimethoxysilane (BPTMS), 1-naphthyltrimethoxysilane (NAPTMS), (9-methylanthracenyl)trimethoxysilane (MANTMS). The organic silane may have hydrophobicity or hydrophilicity according to the organic group. Due to this characteristic, when forming a self-assembled monomolecular layer by applying a solution containing the linkers, processing efficiency may be improved by using a solvent having a property opposite to the organic silane (the solvent of the solution containing the linkers). Where the second mask is formed using an organic silane which forms a hydrophobic layer and a self-assembled monomolecular layer solution is prepared using a hydrophilic solvent, a self-assembled monomolecular layer may be formed more effectively on the surface of the substrate which is exposed through the pores of the organic silane mask.

A material which spontaneously bonds with the linkers may be a metal, a metal oxide, a semiconductor, a semiconductor oxide, a composite metal oxide, or a stack thereof.

In an embodiment of the present disclosure, by performing partial etching after forming the nanobead mask, the diameter of the nanobeads and the distance between most adjacent nanobeads may be controlled. Selective etching in which the substrate is not etched and the beads are selectively etched may be performed. In view of physical stability of a bead arrangement, formation of uniform and controlled separation distance and etching selectivity, dry etching including plasma etching and ion milling etching may be performed. The nanobeads may be a plastic material, the partial etching of the nanobeads may be directional dry etching using an etching gas, and the beads may be etched by an etching gas containing O2, CF4, Ar or a mixture gas thereof.

In another embodiment of the present disclosure, nanoparticles may be patterned by screening portions of a channel region and forming metallic nanoparticles only in open regions. The detailed forming method, used material, and structure of the metallic nanoparticles may be the same as or similar to those described above with reference to FIGS. 1 to 8.

The channel region nanoparticle arrangement pattern may have various structures. For example, the metallic nanoparticles may be uniformly and separately arranged in a direction extending from the source region to the drain region. Further, by defining a unit as a plurality of nanoparticles that are separately aggregated, a structure with a plurality of uniformly arranged aggregates may be formed. The aggregate may have a band shape, a line shape, a circular shape, or a polygonal shape.

As described above, the single electron transistor according to the embodiments of the present disclosure have an advantage in that, because the transistor includes coulomb islands formed of very fine and uniform metallic nanoparticles, the transistor may operate at significantly increased temperatures, particularly room temperature. In addition, because metallic nanoparticles disposed in the channel region of the transistor have a uniform size and are at a specific distance from each other, the operating stability, reproducibility, and reliability of the transistor may become excellent.

The method for fabricating the single electron transistor according to the embodiments of the present disclosure has an advantage in that the method may be commercialized. Commercialization is possible because the methods of production are simple, cost-efficient, and may be done rapidly. Further, the fabrication method makes it possible to minimize the waste of raw materials, because metallic nanoparticles in the channel region of the transistor are prepared in situ. In addition, the size of fine nanoparticles may be controlled in a simple manner by introducing a surfactant during growth of nanoparticles and reacting the introduced surfactant with the nanoparticles. In other words, nanoparticles having a desired size may be prepared. Further, even a fine channel region having a length of 5 nm to 200 nm may be patterned to form a nanoparticle region and an isolation region, and patterning of the channel region may be achieved in a simple manner by controlling the bonding between the linkers and the substrate.

Although various embodiments have been described for illustrative purposes, it will be apparent to those skilled in the art that various changes and modifications may be made without departing from the spirit and scope of the disclosure as defined in the following claims.

What is claimed is:

1. A method for forming a channel of a transistor, comprising:
   forming a substrate;
   forming a porous mask which has a plurality of pores, on the substrate;
   forming linkers on the substrate which is selectively exposed by the porous mask;
   bonding metal ions to the linkers; and
   forming metallic nanoparticles from the metal ions, the metal ions being previously bonded to the linkers formed on the substrate prior to forming the metallic nanoparticles.

2. The method of claim 1, further comprising:
   bonding at least one of a dielectric inorganic material and an inorganic oxide to the metallic nanoparticles.

3. The method of claim 1, further comprising:
   applying energy in forming metallic nanoparticles; and
   supplying an organic surfactant including at least one of a first organic material and a second organic material, before or/and during the applying of the energy.

4. The method of claim 1,
   wherein the substrate includes a surface layer, and
   wherein the surface layer includes, as a material that spontaneously bonds with the linkers, a metal, a metal oxide, a semiconductor, a semiconductor oxide, a composite metal oxide, or a stack thereof.

5. The method of claim 1, wherein the porous mask comprises a single layer of nanobeads as a material, which does not spontaneously bond with the linkers.

6. The method of claim 1, wherein, before the forming of the linkers, the method further comprises:
   forming a thin layer of a material which spontaneously bonds with the linkers on the substrate which is selectively exposed by the porous mask; and
   removing the porous mask.

7. The method of claim 5, wherein the material which spontaneously bonds with the linkers includes a metal, a metal oxide, a semiconductor, a semiconductor oxide, a composite metal oxide, or a stack thereof.

8. The method of claim 1, wherein the linkers are organic monomolecules, and the channel comprises a linker layer composed of a self-assembled monomolecular layer formed by the organic monomolecules.

9. The method of claim 8, wherein the linker layer is formed by bringing a surface of the substrate into contact with a linker solution in which the linkers are dissolved in a solvent.

10. The method of claim 1,
    wherein a plurality of the linkers are bonded to the substrate to form a linker layer, and
    wherein the linker layer is formed by atomic layer deposition using a gas containing the linkers.

11. The method of claim 10, wherein the linker layer is a silane compound layer comprising a functional group selected from a group composed of an amine group, a carboxyl group and a thiol group.

12. The method of claim 1, wherein the linkers comprise one functional group selected from among a group including an amine group, a carboxyl group and a thiol group, which bonds with the metal ions.

13. The method of claim 3, wherein the bonding of the metal ions comprises bringing a metal precursor into contact with the substrate, which is formed with the linkers.

14. The method of claim 1, wherein the bonding of the metal ions comprises applying a solution of a metal precursor to the substrate, which is formed with the linkers, or supplying a gaseous metal precursor to the substrate, which is formed with the linkers.

15. The method of claim 1, wherein energy is applied in forming metallic nanoparticles; and the energy is at least one selected from the group including heat energy, chemical energy, light energy, vibration energy, ion beam energy, electron beam energy, and radiation energy.

16. The method of claim 1, wherein energy is applied in forming metallic nanoparticles; and a different kind of element from the metal ions is supplied during application of the energy to transform the metallic nanoparticles into one selected from the group including metal nanoparticles, metal oxide nanoparticles, metal nitride nanoparticles, metal carbide nanoparticles and intermetallic compound nanoparticles.

17. The method of claim 1, wherein the metallic nanoparticles are formed through in situ reduction and growth of the linker-bonded metal ions.

18. A method of semiconductor fabrication, comprising:
forming a substrate with a channel region;
forming a porous mask with a plurality of pores in a channel region that selectively exposes the substrate;
forming linkers on the channel region of the substrate, which is selectively exposed by the porous mask;
bonding metal ions to the linkers; and
forming metallic nanoparticles from the metal ions, the metal ions being previously bonded to the linkers formed on the substrate prior to forming the metallic nanoparticles.

19. The method of claim 18, wherein the linkers comprises a functional group chemically bonded with metal ions, and wherein the functional group includes an amine group, a carboxyl group, a thiol group, or a combination thereof.

20. The method of claim 18, wherein the metallic nanoparticles are formed through in situ reduction and growth of the linker-bonded metal ions.

* * * * *